(12) United States Patent
Schuelke et al.

(10) Patent No.: US 6,879,608 B1
(45) Date of Patent: Apr. 12, 2005

(54) HIGH COMPLIANCE LASER DRIVER

(75) Inventors: Robert John Schuelke, Lakeville, MN (US); John J. Stronczer, Minneapolis, MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 54 days.

(21) Appl. No.: 10/404,908

(22) Filed: Mar. 31, 2003

(51) Int. Cl.[7] .................................................. H01S 3/00
(52) U.S. Cl. ................................. 372/38.02; 372/38.07
(58) Field of Search ..................... 372/29, 38; 315/151

(56) References Cited

U.S. PATENT DOCUMENTS

| | | | | |
|---|---|---|---|---|
| 4,529,947 A | * | 7/1985 | Biard et al. .................. 330/259 |
| 6,016,081 A | * | 1/2000 | O'Shaughnessy ............ 331/48 |
| 6,097,159 A | * | 8/2000 | Mogi et al. .................. 315/151 |
| 6,535,534 B1 | * | 3/2003 | Fischer ..................... 372/38.07 |
| 6,760,353 B2 | * | 7/2004 | Wang ....................... 372/38.02 |
| 2003/0091076 A1 | * | 5/2003 | Fischer ..................... 372/38.02 |
| 2003/0193977 A1 | * | 10/2003 | Tsai ......................... 372/38.01 |
| 2004/0022284 A1 | * | 2/2004 | Wang ....................... 372/38.02 |

* cited by examiner

Primary Examiner—Don Wong
Assistant Examiner—Hung Tran Vy
(74) Attorney, Agent, or Firm—Incaplaw; Terrence A. Meador

(57) ABSTRACT

A laser driver includes two DC-coupled differential drive circuits in which the common mode voltage of the first differential drive circuit is maintained a level affording a high compliance voltage for a laser diode driven by the second differential drive circuit. This is accomplished by means of an operational amplifier which compares the common mode voltage of the second differential drive circuit to a reference voltage. The operational amplifier operates in a closed-loop configuration to draw current through a common mode bias resistor in the first differential drive circuit in order to force the common mode voltage of the second differential drive circuit to a desired value determined by the reference voltage.

8 Claims, 3 Drawing Sheets

HIGH COMPLIANCE LASER DRIVER

BACKGROUND OF THE INVENTION

The present invention relates to a laser driver, and more particularly to a circuit and method for maximizing available compliance voltage in a laser driver circuit.

In this specification, transistors are shown as bipolar junction transistors (NPN's, specifically). This is for convenience and illustration, it being understood that the circuits illustrated and described may also be implemented with metal-oxide silicon (MOS) or other equivalent devices.

The most common implementation of a laser driver includes a differential pair of transistors in parallel with a constant current source. One common arrangement of transistors in a laser driver is shown in FIG. 1. The laser driver of FIG. 1 includes a pair of differentially coupled and driven transistors 12 and 14, hereinafter referred to as "the predrive differential pair 15", and also as a "first differential drive circuit". The predrive differential pair 15 has a common node 13 where the emitters of the transistors 12 and 14 are connected in common to a current source 17a. The bases of the transistors 12 and 14 are the input of the predrive transistor pair 15. A connection to a supply voltage (+) for the predrive differential pair 15 is provided through resistive connections to the respective collectors of the transistors 12 and 14. The components of an amplified differential signal are provided from the predrive differential pair through an output including nodes 16a and 16b to which the collectors of the transistors 12 and 14 respectively are connected.

A differential laser modulation signal is input to the differential pair 15 through the bases of the transistors 12 and 14, amplified and output via nodes 16a and 16b. The predrive differential pair 15 may be either DC or AC coupled to a laser diode 20 through combinations of passive components such as transistors, resistors, capacitors, or inductors. For example FIG. 1 depicts a DC coupled arrangement where the nodes 16a and 16b forming the output of the differential pair 15 are connected to the bases of respective NPN transistors 18 and 19. Current is provided to the transistors 18 and 19 by current sources 17b and 17c, respectively. The NPN transistors comprise a high speed buffer circuit which amplifies the two components of the amplified predrive differential signal produced by the predrive differential pair 15, providing the amplified components to the bases of transistors 24 and 25. The transistors 24 and 25 form a "drive differential pair" 30 (also a "second differential drive circuit"); their bases form the input of the drive differential pair 30. The emitters of the drive differential pair 30 are connected in common to a current source 17d. The drive differential pair has a connection to the supply voltage through the collector of the transistor 24, which is connected to the supply voltage +, and through the laser diode 20, which is connected in series between an output node 31 in the collector of the transistor 25 and the supply voltage +. The laser diode 20 is biased on at a low level by a DC current bias source 32 connected to the cathode of the laser diode and to the output node 31. The output of the laser driver consists of light produced by the lasing action of the laser diode 20 when it is biased at or above its compliance voltage.

One of the important objectives of a laser driver is the maximization of "compliance voltage" for the laser diode being driven. In this regard, a compliance voltage is the minimum voltage required by a specific, electrically-actuated component to operate. For example, it is necessary to have a minimum voltage across the laser diode 20 of FIG. 1 for it to be forward biased and to lase. A representative value for this voltage is 1.6 volts down from the supply voltage +, presuming a minimum compliance voltage of 2.3 volts available from the circuit. This minimum magnitude of this voltage (the laser diode's compliance voltage) is dependent on the drive current running through the laser diode, and the higher the drive current, the higher the compliance voltage. In FIG. 1, the compliance voltage is measured between the supply voltage (+) and the cathode of the laser diode 20. Laser diode characteristics vary widely with process and, consequently, so does the compliance voltage. Therefore, it is desirable to provide a laser driver that can maximize the voltage available to the laser while not adversely limiting the operation of the laser driving circuit itself (i.e., running into the compliance voltages of the other components that make up the driver circuit). Without maximizing the available compliance voltage to the laser it is possible that the laser may not lase under all conditions (i.e., process, temp, supply voltage).

There are advantages and disadvantages to DC or AC coupling in the context of achieving a given compliance voltage for the laser diode 20. AC coupling facilitates the achievement of the compliance voltage by separating the voltage level on the laser diode from that on the output driver. However, AC coupling requires additional components that are typically external to the IC implementation of the laser driver. AC coupling also requires that a termination resistor be placed on the output node of the drive differential pair. The presence of this termination resistor results in current division between the resistor and the laser diode. To compensate for this current division complicated feedback circuitry based on the optical output of the laser must be employed to obtain the desired optical output levels. The current division also requires the dissipation of more power than what is minimally required to achieve the desired optical output levels from the laser diode 20. In many applications (e.g. parallel fiber) the external AC coupling components, optical feedback mechanisms, and excessive power dissipation are not tolerable due to the requirements for tight spacing, low cost, and low power consumption. DC coupling in such applications is therefore the desirable mode as it eliminates the external components and feedback loop while minimizing power dissipation.

It is frequently the case in DC-coupled laser drivers that a large supply voltage is required to achieve the compliance voltage on the laser diode. However, with increasing demand for reduced supply voltages to minimize power dissipation a new scheme is required to optimize the laser compliance voltage.

In the laser driver of FIG. 1, the common mode voltage of the predriver differential pair 15 is sometimes modified in an open-loop fashion to maintain the drive voltage on the drive differential pair at levels that will prevent forward biasing of the transistor collect-to-base junctions in the drive differential pair. A diagram of such an implementation is shown in FIG. 2.

In FIG. 2, the laser driver of FIG. 1 is modified by provision of a common mode setting current source 41 connected in common to the two collector resistors 44 and 45 of the predrive differential pair 15 at a supply node 47. The supply node 47 receives a supply voltage for the predrive differential pair connected through a voltage sampling circuit preferably comprising a parallel RC circuit connected to the supply node 47. The parallel RC circuit includes a common mode bias resistor 50 connected in parallel with a capacitor 51 to the voltage supply +. The current source 41 mimics the circuit path to the drive differential pair 30 and provides a current at a level sufficient to cause the common mode voltage of the predriver differential pair 15 to be set at an appropriate level to obtain the desired output compliance voltage. While providing advantage over the laser driver of FIG. 1, this approach does not present a highly stable compliance range over process, temperature, and supply voltage such that the compliance voltage of the laser diode 20 is maximized. Consequently, AC coupling is still frequently used with this approach.

DETAILED DESCRIPTION OF THE PREFERRED EMBODIMENTS

Figure 2:
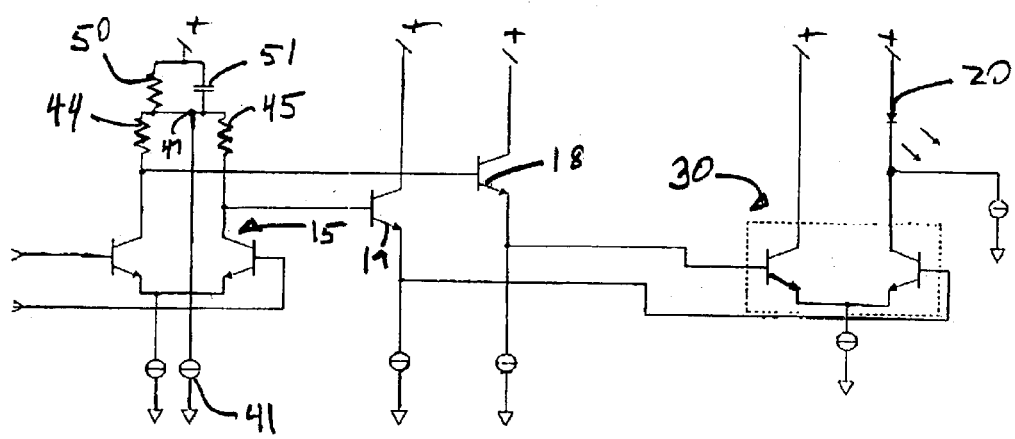
FIG. 2 is a schematic diagram showing a modification of the prior art laser driver circuit of FIG. 1.

The current invention looks to improve upon the laser diode compliance voltage offered by the open-loop laser driver of FIG. 2 by providing closed-loop control for the common mode voltage of the predrive differential pair 15. Our preferred embodiment is shown schematically in FIG. 3.

Figure 3:
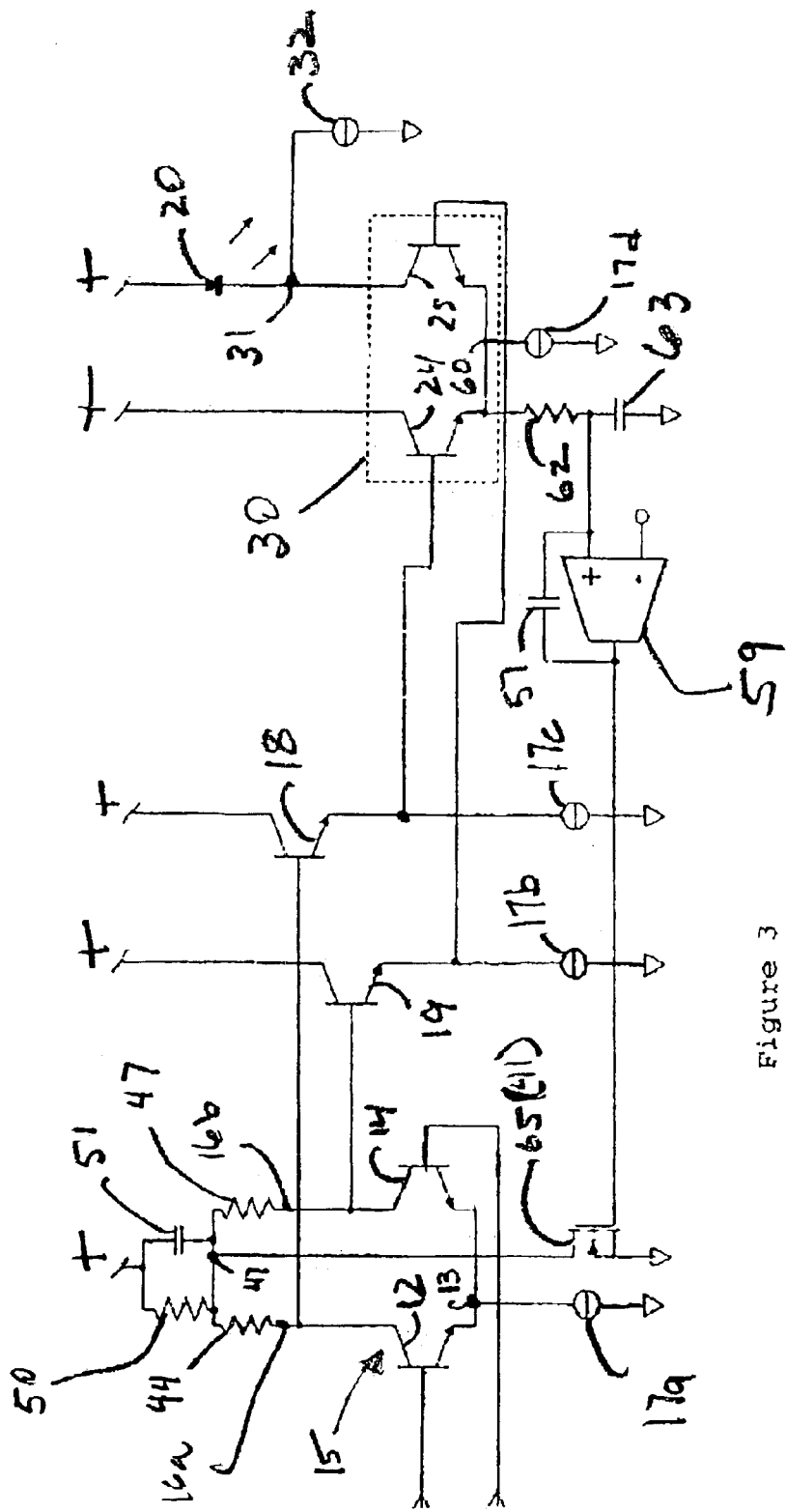
FIG. 3 is a schematic diagram showing the laser driver circuit of the invention.

In FIG. 3, an operational transconductance amplifier (OTA) 59 compares the common mode voltage on the common emitter node 60 of the drive differential pair to a reference voltage, VREF. The OTA 59 operates in a closed-loop configuration to control the amount of current drawn through the common mode bias resistor 50 of the predriver differential pair 15. The OTA exerts this control by setting the current generated by the common mode setting current source 41. Preferably, the source 41 is a linear device that generates a current whose magnitude is established by the magnitude of a voltage output by the OTA 59. The objective is to adjust this current to a magnitude that forces the common mode voltage of the driver differential pair 30 to a desired value determined by the difference between the magnitude of the common mode voltage at node 60 to which the non-inverting (+) input of the OTA 59 is connected and a voltage $V_{REF}$ connected to the inverting (−) input of the OTA 59. Such control is effected by the common mode setting current source 41 which, preferably, is a linear device acting as a variable current source producing a current whose magnitude is determined by the magnitude of the voltage output by the OTA 59. For example, the source 41 may be embodied as an n-channel field effect transistor 65 (FET) whose gate is connected to the output of the OTA 59. If the voltage at the common emitters of the drive differential pair rises above VREF, the FET 65 will increase the amount of current it generates and, thereby, the voltage drop across the common mode resistor 50 and result in the common emitter voltage being pulled down. A large time constant RC filter includes a resistor 62 having a terminal connected to the node 60 and a terminal connected to the positive input (+) of the OTA 59 and a capacitor 63 having a terminal connected to the positive input (+) of the OTA 59 and a terminal connected to ground. The large time constant is used to the common mode voltage present on the node 60 of the drive differential pair 30. In the event that this filter presents excessive load capacitance to the drive differential pair 30 a replica circuit may be used to implement a quasi closed-loop configuration. A feedback capacitor 57 is provided between the noninverting input and the output of the OTA 59.

Figure 1:
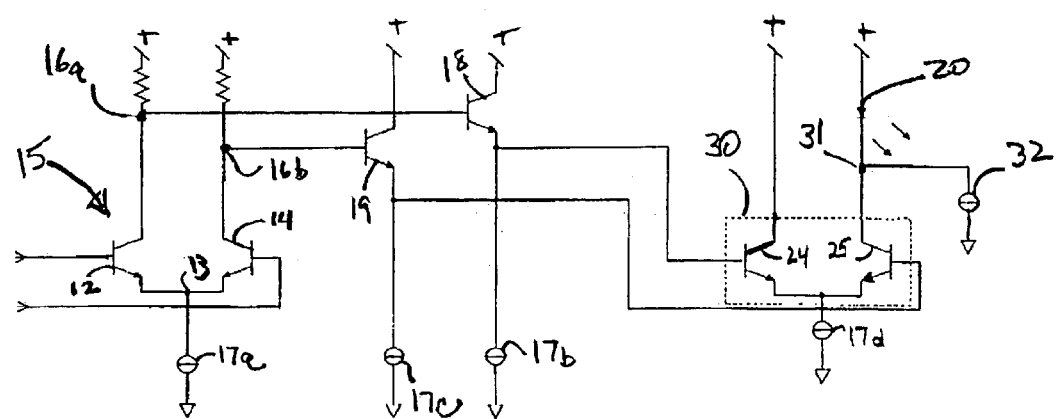
FIG. 1 is a schematic diagram showing a prior art laser driver circuit.

Careful, design-driven choice of the reference voltage $V_{REF}$ in the laser driver of FIG. 1 will allow the common mode voltage of the drive differential pair 30 and, consequently, the compliance voltage of the laser driver to be precisely controlled and to be maximized for a given supply voltage and technology.

The laser driver of FIG. 3 uses the DC current bias source 32 in the collector of the transistor 25. Due to the compliance voltage of such a current source and the saturation voltage of the drive differential pair 30 itself, there will be a hard limit on how large the available compliance voltage for the laser diode 20 can be made. However, a small alteration to the circuit and a different choice of reference voltage can increase the available compliance voltage further. This is accomplished by replacing the current source 32 with a simple resistor and ensuring that the reference voltage $V_{REF}$ is such that the desired laser diode modulation current will flow through the resistor by forcing the correct voltage at the common node of the drive differential pair 30.

As compared to the prior art this invention provides benefits in terms of its ability to provide an increased laser driver compliance voltage over all operating conditions of the circuit while completely eliminating any need for AC coupling to the laser diode.

While various embodiments of the invention are described above, it should be understood that they are presented for example only, and not as limitations to the following claims. Accordingly, the scope and breadth of the present invention should only be defined in accordance with the following claims and their equivalents.

What is claimed is:

1. A laser driver, comprising:
    a first differential drive circuit having an input, an output, and a supply node for receiving a supply voltage;
    a parallel RC circuit connected to the supply node for providing the supply voltage to the supply node;
    a common mode current setting source connected to the supply node for generating a common mode current through the parallel RC circuit;
    an amplifying circuit with an output and an input connected to the output of the first differential drive circuit;
    a second differential drive circuit having an input connected to the output of the amplifying circuit, a common emitter node, and an output node;
    a laser diode connected to the output node;
    a current bias source connected to the output node;
    amplifier means coupled to the emitter node and to the common mode current setting source for comparing a common mode voltage on the common emitter node with a reference voltage and adjusting the common mode current in response to the comparison in order to adjust a common mode voltage of the first differential circuit; and
    an RC time constant circuit connected to the emitter node; and
    the amplifier means having a first input connected to the RC time constant circuit and a second input for receiving the reference voltage.

2. The laser driver of claim 1, further comprising:
    the amplifier means having an output;
    the common mode current setting source including a field effect transistor having a gate; and
    the output being connected to the gate.

3. The laser driver of claim 2, wherein the amplifier means includes an operational transconductance amplifier.

4. The laser driver of claim 3, wherein:

the first differential drive circuit includes a first transistor with a collector and an emitter, a second transistor with a collector and an emitter connected to the emitter of the first transistor, a first resistor with a first terminal connected to the collector of the first transistor and a second terminal connected to the supply node, a second resistor with a first terminal connected to the collector of the second transistor and a second terminal connected to the supply node; and the parallel RC circuit includes a resistor with a first terminal connected to the supply node and a second terminal for receiving a supply voltage, and a capacitor with a first terminal connected to the supply node and a second terminal for receiving the supply voltage.

5. A laser driver, comprising a predrive differential circuit having an input, an output, and a supply node for receiving a supply voltage;

a resistor with a first terminal connected to the supply node and a second terminal for receiving a supply voltage;

a capacitor with a first terminal connected to the supply node and a second terminal for receiving a supply voltage;

a common mode current setting source connected to the supply node for generating a common mode current at the supply node;

an amplifying circuit with an output and an input connected to the output of the predrive differential circuit;

a drive differential circuit having an input connected to the output of the amplifying circuit, a common emitter node, and an output node;

a laser diode connected to the output node;

a current bias source connected to the output node;

an operational amplifier coupled to the emitter node and to the common mode current setting source for comparing a common mode voltage on the common emitter node with a reference voltage and adjusting the common mode current in response to the comparison in order to adjust a common mode voltage of the predrive differential circuit; and an RC time constant circuit connected to the emitter node; and the operational amplifier having a first input connected to the RC time constant circuit and a second input for receiving the reference voltage.

6. The laser driver of claim 5, further comprising:

the operational amplifier having an output; the common mode current setting source including a field effect transistor having a gate; and the output being connected to the gate.

7. The laser driver of claim 6, wherein the operational amplifier includes an operational transconductance amplifier.

8. The laser driver of claim 5, wherein:

the predrive differential circuit includes a first transistor with a collector and an emitter, a second transistor with a collector and an emitter connected to the emitter of the first transistor, a first resistor with a first terminal connected to the collector of the first transistor and a second terminal connected to the supply node, a second resistor with a first terminal connected to the collector of the second transistor and a second terminal connected to the supply node;

the operational amplifier having an output;

the common mode current setting source including a field effect transistor having a gate and a terminal connected to the supply node; and the output being connected to the gate.

* * * * *